US 8,627,264 B1

(12) United States Patent
Venkitachalam et al.

(10) Patent No.: US 8,627,264 B1
(45) Date of Patent: Jan. 7, 2014

(54) AUTOMATED VERIFICATION OF TRANSFORMATIONAL OPERATIONS ON A PHOTOMASK REPRESENTATION

(75) Inventors: Girish Venkitachalam, San Jose, CA (US); Hai Thai Dang, San Jose, CA (US); Peter J. McElheny, Morgan Hill, CA (US); Kuan Yeow Leong, Penang (MY)

(73) Assignee: Altera Corporation, San Jose, CA (US)

( * ) Notice: Subject to any disclaimer, the term of this patent is extended or adjusted under 35 U.S.C. 154(b) by 569 days.

(21) Appl. No.: 12/475,416

(22) Filed: May 29, 2009

(51) Int. Cl.
*G06F 11/22* (2006.01)
*G06F 17/50* (2006.01)

(52) U.S. Cl.
USPC ........... 716/136; 716/111; 716/119; 716/126; 716/50

(58) Field of Classification Search
USPC .................. 716/50, 54, 55, 132, 119, 126
See application file for complete search history.

(56) References Cited

U.S. PATENT DOCUMENTS

| | | | | |
|---|---|---|---|---|
| 6,289,493 | B1 * | 9/2001 | Kita .............................. | 716/106 |
| 6,321,367 | B1 * | 11/2001 | Chun et al. ...................... | 716/55 |
| 7,293,247 | B1 * | 11/2007 | Newton et al. ................ | 716/111 |
| 2005/0028113 | A1 * | 2/2005 | Lin et al. ........................... | 716/3 |
| 2005/0177811 | A1 * | 8/2005 | Kotani et al. ..................... | 716/21 |
| 2007/0245275 | A1 * | 10/2007 | Jandhyala et al. ................. | 716/4 |
| 2007/0245375 | A1 * | 10/2007 | Tian et al. ....................... | 725/45 |
| 2007/0250800 | A1 * | 10/2007 | Keswick ........................... | 716/8 |
| 2008/0005713 | A1 * | 1/2008 | Singh et al. ...................... | 716/11 |
| 2008/0042266 | A1 * | 2/2008 | Kagaya et al. ................. | 257/724 |
| 2008/0127029 | A1 * | 5/2008 | Graur et al. ..................... | 716/21 |
| 2008/0244483 | A1 * | 10/2008 | Chang et al. ....................... | 716/5 |
| 2008/0250384 | A1 * | 10/2008 | Duffy et al. ..................... | 716/21 |
| 2009/0293034 | A1 * | 11/2009 | Pai et al. ........................... | 716/7 |
| 2009/0297019 | A1 * | 12/2009 | Zafar et al. .................... | 382/145 |
| 2010/0162191 | A1 * | 6/2010 | McCracken ....................... | 716/5 |

OTHER PUBLICATIONS

Antonip J. Lopez Martin, Cadence Design Environment, Klipsch School of Electrical and Computer Engineering New Mexico State University, Oct. 2002.*

* cited by examiner

*Primary Examiner* — Thuan Do
*Assistant Examiner* — Brian Ngo
(74) *Attorney, Agent, or Firm* — Womble Carlyle Sandridge & Rice LLP

(57) ABSTRACT

In an example embodiment, an EDA application creates a physical PCell from a CAD database that relates the physical PCell to a collection of expected mask layers. The EDA application auto-places an identifying text label with the physical and converts the physical PCell and the text label to a format that represents the physical PCell and the text label as sequence of drawn layers. The EDA application generates an equation that performs transformational operations on the drawn layers to create a sequence of derived layers, where the sequence of derived layers defines a collection of logical mask layers. The EDA application executes the equation and compares a derived layer to the expected mask layers, if the derived layer interacts with the derived layer for the text label. If the compared derived layer varies from the expected mask layers, the EDA application reports a variance based on the text label.

18 Claims, 9 Drawing Sheets

| No | Device Name | Pcell Name | A | B | C | D | E | F | G | H | I | J | K | L | M |
|---|---|---|---|---|---|---|---|---|---|---|---|---|---|---|---|
| 1 | Transistor 1 | TNG45CAPDH | 1 | 1 | 1 | 0 | 0 | 1 | 1 | 0 | 0 | 0 | 0 | 1 | 0 |
| 2 | Transistor 2 | TNG45CAPDH | 1 | 1 | 1 | 0 | 0 | 1 | 1 | 0 | 0 | 0 | 0 | 1 | 0 |
| 3 | Transistor 3 | TNG45CAPDH | 1 | 1 | 1 | 0 | 0 | 1 | 1 | 0 | 0 | 0 | 0 | 1 | 0 |
| 4 | Transistor 4 | TNG45CAPDH | 1 | 1 | 1 | 0 | 0 | 1 | 1 | 0 | 0 | 0 | 0 | 1 | 0 |
| 5 | Transistor 5 | TNG45CAPDH | 1 | 1 | 1 | 0 | 0 | 1 | 1 | 0 | 0 | 0 | 0 | 0 | 0 |
| 6 | Transistor 6 | TNG45CAPDS | 1 | 1 | 1 | 0 | 0 | 1 | 1 | 0 | 0 | 0 | 0 | 0 | 0 |
| 7 | Transistor 7 | TNG45CAPDS | 1 | 1 | 1 | 0 | 0 | 1 | 1 | 0 | 0 | 0 | 0 | 0 | 0 |
| 8 | Transistor 8 | TNG45CAPDS | 1 | 1 | 1 | 0 | 0 | 1 | 1 | 1 | 0 | 0 | 0 | 0 | 0 |
| 9 | Transistor 9 | TNG45CAPDS | 1 | 1 | 1 | 0 | 0 | 1 | 1 | 0 | 0 | 0 | 0 | 1 | 0 |
| 10 | Transistor 10 | TNG45CAPDS | 1 | 0 | 1 | 0 | 0 | 1 | 1 | 0 | 0 | 0 | 0 | 1 | 0 |
| 11 | Transistor 11 | TNG45CAPH | 1 | 0 | 1 | 0 | 0 | 1 | 1 | 0 | 0 | 0 | 0 | 1 | 0 |
| 12 | Transistor 12 | TNG45CAPH | 1 | 0 | 1 | 0 | 0 | 1 | 1 | 0 | 0 | 0 | 0 | 0 | 0 |
| 13 | Transistor 13 | TNG45CAPH | 1 | 0 | 1 | 0 | 0 | 1 | 1 | 0 | 0 | 0 | 0 | 0 | 0 |
| 14 | Transistor 14 | TNG45CAPH | 1 | 0 | 1 | 0 | 0 | 1 | 1 | 0 | 0 | 0 | 0 | 0 | 0 |
| 15 | Transistor 15 | TNG45CAPS | 1 | 0 | 1 | 0 | 0 | 1 | 1 | 0 | 0 | 0 | 0 | 1 | 0 |
| 16 | Transistor 16 | TNG45CAPS | 1 | 0 | 1 | 0 | 0 | 1 | 1 | 0 | 0 | 0 | 0 | 1 | 0 |
| 17 | Transistor 17 | TNG45CAPS | 1 | 0 | 1 | 0 | 0 | 1 | 1 | 0 | 0 | 0 | 0 | 1 | 0 |
| 18 | Transistor 18 | TNG45CAPS | 1 | 0 | 1 | 0 | 0 | 1 | 1 | 0 | 0 | 0 | 0 | 1 | 0 |
| 19 | Transistor 19 | TNG45CAPS | 1 | 0 | 1 | 0 | 0 | 1 | 1 | 0 | 0 | 0 | 0 | 0 | 0 |
| 20 | Transistor 20 | TNG45CAPS | 1 | 0 | 1 | 0 | 0 | 1 | 1 | 0 | 0 | 0 | 0 | 0 | 0 |
| 21 | Transistor 21 | TNG45DH | 1 | 1 | 1 | 0 | 0 | 1 | 1 | 0 | 0 | 0 | 0 | 1 | 0 |
| 22 | Transistor 22 | TNG45DH | 1 | 1 | 1 | 0 | 0 | 1 | 1 | 0 | 0 | 0 | 0 | 1 | 0 |
| 23 | Transistor 23 | TNG45DH | 1 | 1 | 1 | 0 | 0 | 1 | 1 | 0 | 0 | 0 | 0 | 1 | 0 |
| 24 | Transistor 24 | TNG45DH | 1 | 1 | 1 | 0 | 0 | 1 | 1 | 0 | 0 | 0 | 0 | 1 | 0 |
| 25 | Transistor 25 | TNG45DH | 1 | 1 | 1 | 0 | 0 | 1 | 1 | 0 | 0 | 0 | 0 | 1 | 0 |
| 26 | Transistor 26 | TNG45DH | 1 | 1 | 1 | 0 | 0 | 1 | 1 | 0 | 0 | 0 | 0 | 1 | 0 |
| 27 | Transistor 27 | TNG45DH | 1 | 1 | 1 | 0 | 0 | 1 | 1 | 0 | 0 | 0 | 0 | 1 | 0 |
| 28 | Transistor 28 | TNG45DH | 1 | 1 | 1 | 0 | 0 | 1 | 1 | 0 | 0 | 0 | 0 | 1 | 0 |
| 29 | Transistor 29 | TNG45DH | 1 | 1 | 1 | 0 | 0 | 1 | 1 | 0 | 0 | 0 | 0 | 1 | 0 |
| 30 | Transistor 30 | TNG45DS | 1 | 1 | 1 | 0 | 0 | 1 | 1 | 0 | 0 | 0 | 0 | 0 | 0 |

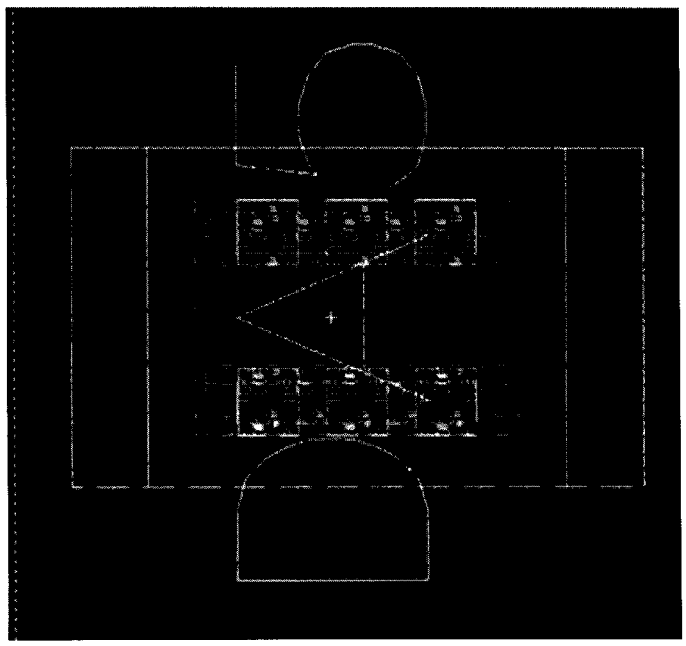
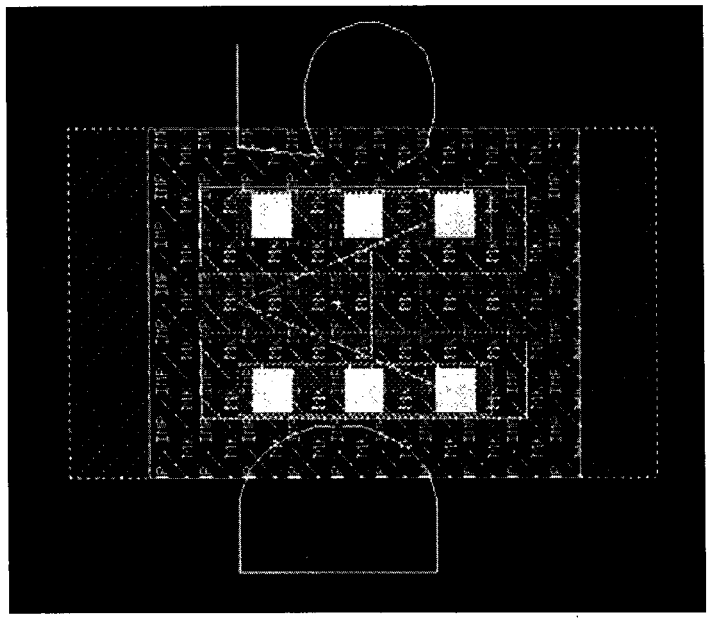
Automatic EFLOP Check
Figure 5

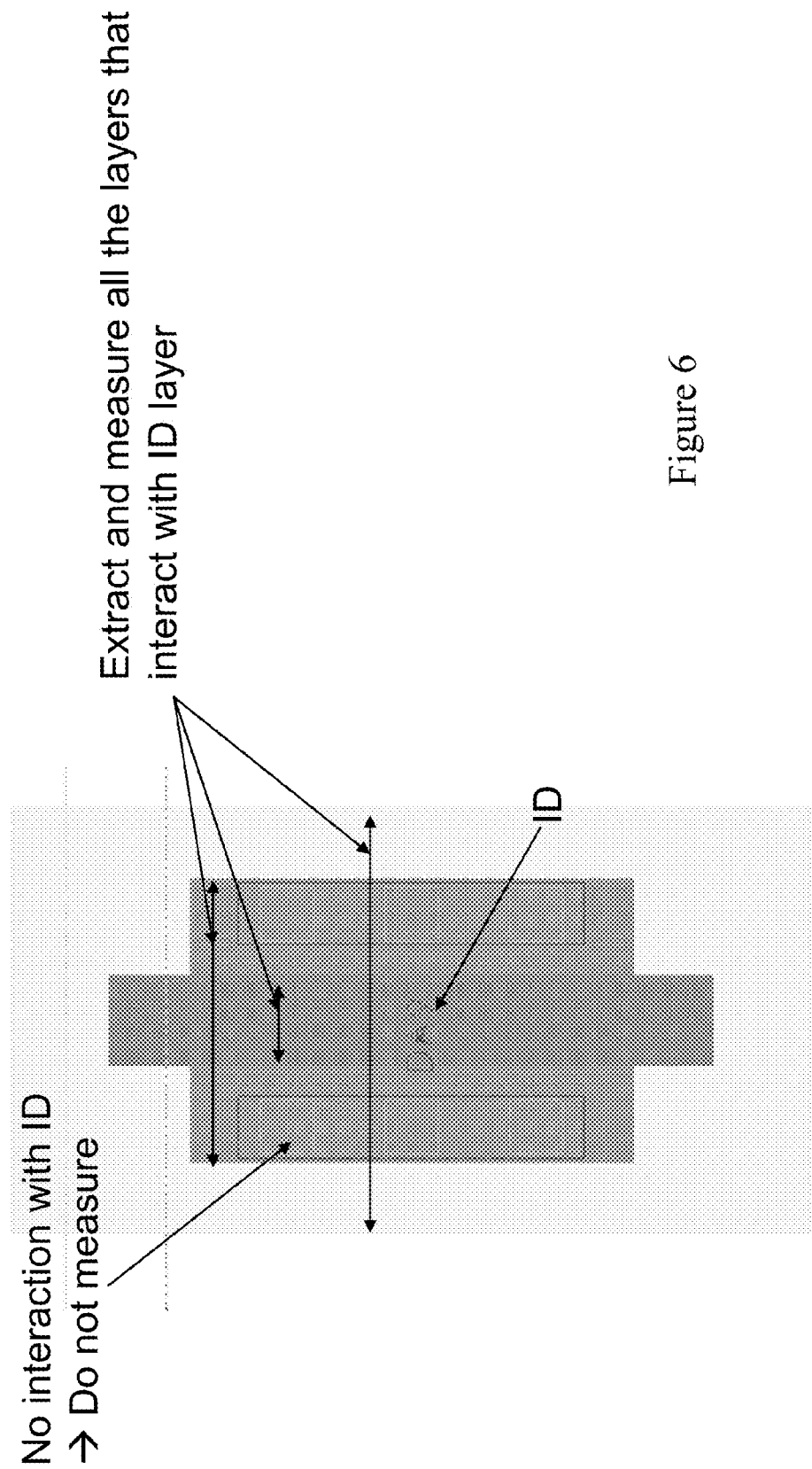

Verify the masks eLOP Device Truth Table

| Type | Device Description | Symbol | eLOP Mask Layers |||||||||||||||||||||||||||||||
|---|---|---|---|---|---|---|---|---|---|---|---|---|---|---|---|---|---|---|---|---|---|---|---|---|---|---|---|---|---|---|---|
| | | | 120 (OD) B | C | D | E | F | G | H | I | J | K | L | 130 (PO) N | O | P | Q | R | S | T | U | V | W | Z | AA | AB | AC | AD | AE | AF | AG | AH | AI | AJ |
| G DEV | Tone | | D | C | D | C | C | C | C | C | D | C | C | D | C | C | C | C | C | C | C | C | C | C | C | C | C | C | C | C | C | C | C |
| | Transistor 1 | TNG45DS | 1 | 1 | 0 | 0 | 0 | 0 | 0 | 0 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 |
| | Transistor 2 | TNG45DH | 1 | 1 | 0 | 0 | 0 | 0 | 0 | 0 | 1 | 1 | 1 | 1 | 0 | 0 | 0 | 0 | 0 | 0 | 0 | 0 | 0 | 0 | 0 | 0 | 0 | 0 | 1 | 0 | 0 | 0 | 1 |
| | Transistor 3 | TPG45DS | 1 | 1 | 1 | 0 | 0 | 0 | 1 | 0 | 0 | 0 | 0 | 1 | 0 | 0 | 0 | 0 | 0 | 0 | 0 | 0 | 0 | 0 | 0 | 0 | 0 | 0 | 1 | 0 | 0 | 0 | 0 |
| | Transistor 4 | TPG45DH | 1 | 1 | 1 | 0 | 0 | 0 | 1 | 0 | 0 | 0 | 0 | 1 | 0 | 0 | 0 | 0 | 0 | 0 | 0 | 0 | 0 | 0 | 0 | 0 | 0 | 0 | 1 | 0 | 0 | 1 | 0 |
| | Transistor 5 | TNG45S | 1 | 0 | 0 | 0 | 0 | 1 | 0 | 0 | 0 | 1 | 1 | 1 | 0 | 0 | 0 | 0 | 0 | 0 | 0 | 1 | 0 | 0 | 0 | 0 | 0 | 1 | 0 | 0 | 1 | 0 | 1 |
| | Transistor 6 | TNG45H | 1 | 0 | 0 | 0 | 0 | 1 | 0 | 0 | 0 | 1 | 1 | 1 | 0 | 0 | 0 | 0 | 0 | 0 | 0 | 1 | 0 | 0 | 0 | 0 | 1 | 0 | 0 | 0 | 1 | 0 | 1 |
| | Transistor 7 | TPG45S | 1 | 0 | 1 | 0 | 0 | 1 | 0 | 0 | 0 | 0 | 0 | 1 | 0 | 0 | 0 | 0 | 0 | 0 | 0 | 1 | 0 | 0 | 0 | 0 | 0 | 1 | 0 | 0 | 1 | 0 | 1 |
| | Transistor 8 | TPG45H | 1 | 0 | 1 | 0 | 0 | 1 | 0 | 0 | 0 | 0 | 0 | 1 | 0 | 0 | 0 | 0 | 0 | 0 | 0 | 1 | 0 | 0 | 0 | 0 | 1 | 0 | 0 | 0 | 1 | 0 | 0 |

← 701

- "0" does not require
- "1" require

Verify the dimension

OD CAD Bias Check

| Type | Device | Dimension | CAD Bias | Errors |
|---|---|---|---|---|
| G | NMOS | 0.298 | 0.005 | 0.00% |
| | PMOS | 0.298 | 0.005 | 0.00% |
| LP+ | NMOS | 0.298 | 0.005 | 0.00% |
| | PMOS | 0.298 | 0.005 | 0.00% |
| I/O | NMOS | 0.523 | 0.005 | 0.00% |
| | PMOS | 0.523 | 0.005 | 0.00% |
| | VAR | 2.332 | 0.005 | 0.00% |

← 702

PO CAD Bias Check

| Type | Device | Dimension | CAD Bias | Errors |
|---|---|---|---|---|
| G | NMOS | 0.12 | 0.015 | 0.00% |
| | PMOS | 0.119 | 0.0145 | 0.00% |
| LP+ | NMOS | 0.128 | 0.019 | 0.00% |
| | PMOS | 0.127 | 0.0185 | 0.00% |
| I/O | NMOS | 0.301 | 0.029 | 0.00% |
| | PMOS | 0.301 | 0.029 | 0.00% |
| | VAR | 2.056 | 0.029 | 0.00% |

AUTOMATED VERIFICATION OF TRANSFORMATIONAL OPERATIONS ON A PHOTOMASK REPRESENTATION

BACKGROUND

Integrated circuit layout (IC layout) is the representation of an integrated circuit in terms of planar geometric shapes (or polygons) which correspond to the patterns of metal, oxide, or semiconductor layers that make up the components of the integrated circuit. When the interaction of the many chemical, thermal, and photographic variables are known and carefully controlled, the performance and size of a final integrated circuit depends largely on the positions and interconnections of these planar geometric shapes. In earlier days, layout engineers did IC layout by hand using opaque tapes and films. More modernly, layout engineers do IC layout with the aid of software tools including layout editors or electronic design automation (EDA) applications. The manual operation of choosing and positioning the planar geometric shapes is informally known as "polygon pushing".

Once the IC layout is complete, it is: (a) translated into an industry standard binary format such as Graphic Data System II (GDSII) stream format; (b) processed using transformational operations including set operations and geometric operations such as Boolean operations on polygons and sizing operations (e.g., expansion and shrinkage); and (c) verified, e.g., using verification processes such as Design Rule Checking (DRC) and Layout Versus Schematic (LVS) verification. Then the IC layout is transferred to a semiconductor foundry in a step sometimes referred to as "tape-out". Ultimately, the semiconductor foundry uses data resulting from the IC layout to generate the photolithographic photomasks that control semiconductor device fabrication.

It will be appreciated that an error in an IC layout and its resulting photomask can be extremely costly in terms of both time and resources. Consequently, there is a need to catch any errors in an IC layout as early as possible, including errors with regard to transformational operations. The embodiments described below include functionality for catching such errors, along with additional functionality which is widely applicable to this and other fields.

SUMMARY

In an example embodiment, an EDA application creates a physical parameterized cell (PCell) from a CAD (computer-aided design) database that relates the PCell to a collection of expected mask layers. The EDA application auto-places the an identifying text label with a physical PCell and converts the physical PCell and the text label to a format (e.g., GDSII stream format) that represents the physical PCell and the text label as a sequence of drawn layers. The EDA application generates and stores an equation that performs transformational operations on the drawn layers to create a sequence of derived layers, where the sequence of derived layers define a collection of logical mask layers. The EDA application then executes the equation and compares a resulting derived layer to the expected mask layers, if the derived layer interacts with the derived layer for the text label. Finally, if the compared derived layer varies from the expected mask layers, the EDA application reports a variance based on the text label, to assist the user of the EDA program in adjusting the equation.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood from the following detailed description when read in conjunction with the accompanying drawings.

FIG. 2 is a diagram of a GUI view showing a database table whose columns indicate expected mask layers in NMOS (n-type metal-oxide-semiconductor) transistors, in accordance with an example embodiment.

FIG. 4 is a diagram showing an example equation that performs geometric operations on drawn layers, in accordance with an example embodiment.

FIG. 5 is a diagram illustrating the drawn layers and the derived layers for an NMOS transistor, in accordance with an example embodiment.

FIG. 6 is a schematic diagram illustrating the derived layers that interact with the derived layer for a text identifier, in accordance with an example embodiment.

FIG. 7 is a diagram showing a table with (a) expected mask layers and (b) expected dimensions for a poly (PO) layer and a thin oxide (OD) layer in various NMOS and PMOS (p-type metal-oxide-semiconductor) transistors, in accordance with an example embodiment.

DETAILED DESCRIPTION

In the following description, numerous specific details are set forth in order to provide a thorough understanding of the example embodiments. However, it will be apparent to one skilled in the art that the example embodiments may be practiced without some of these specific details. In other instances, process operations and implementation details have not been described in detail, if already well known in the art.

Figure 1A:
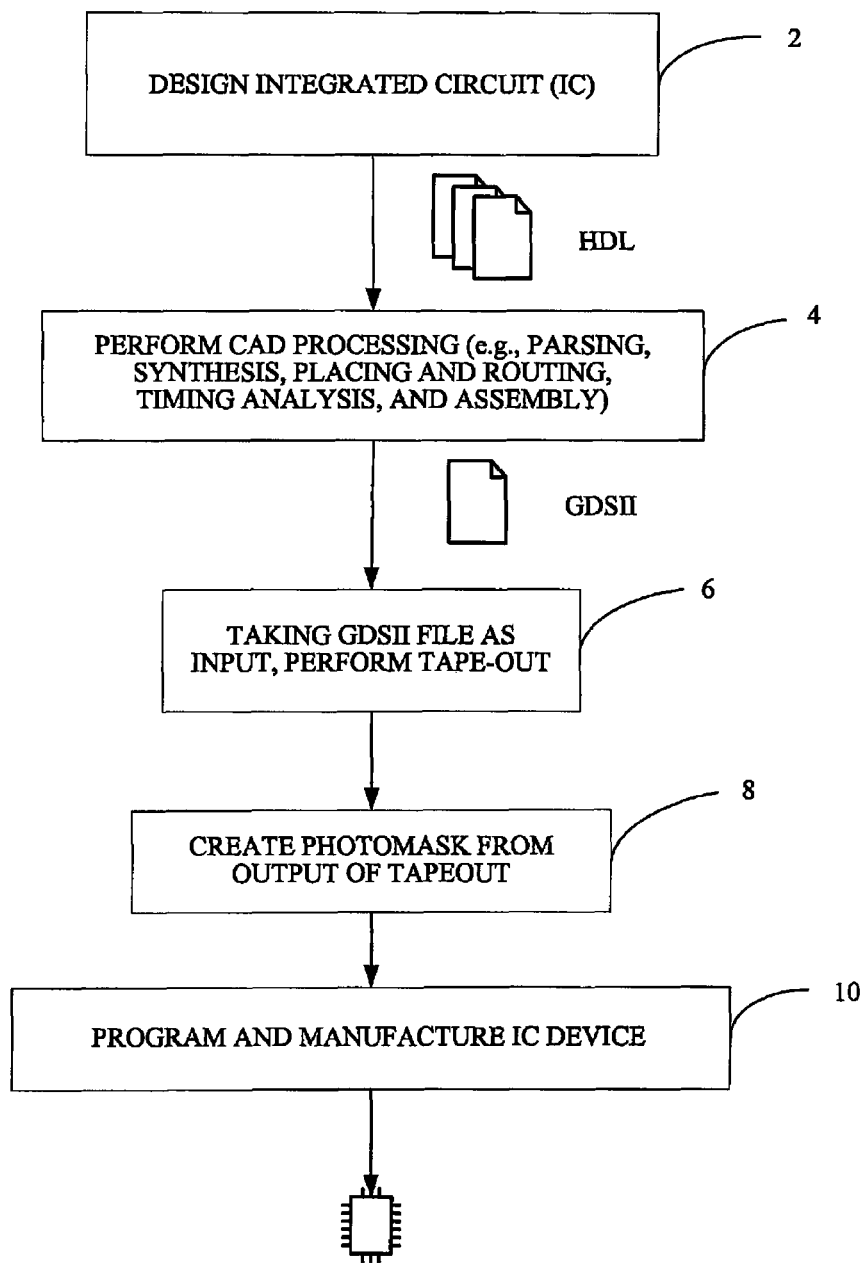
FIG. 1A is a flowchart diagram of a high-level process for designing and manufacturing an IC, in accordance with an example embodiment.

FIG. 1A is a flowchart diagram of a high-level process for designing and manufacturing an IC, in accordance with an example embodiment. The process starts in operation 2 with a design for an integrated circuit produced by a hardware engineer who creates HDL (hardware description language) files containing the desired circuitry description. In operation 4, the HDL files become an input to CAD processing which typically involves parsing the HDL, synthesizing a netlist, placing and routing, timing analysis, and assembly. Operation 6 of the process is tape-out, which takes as input a binary file (e.g., in GDSII stream format). In operation 8, the tape-out output is used to create a photomask for the photolithograpy which takes place operation 10, along with the other operations involving programming and manufacture of the IC device.

Figure 1B:
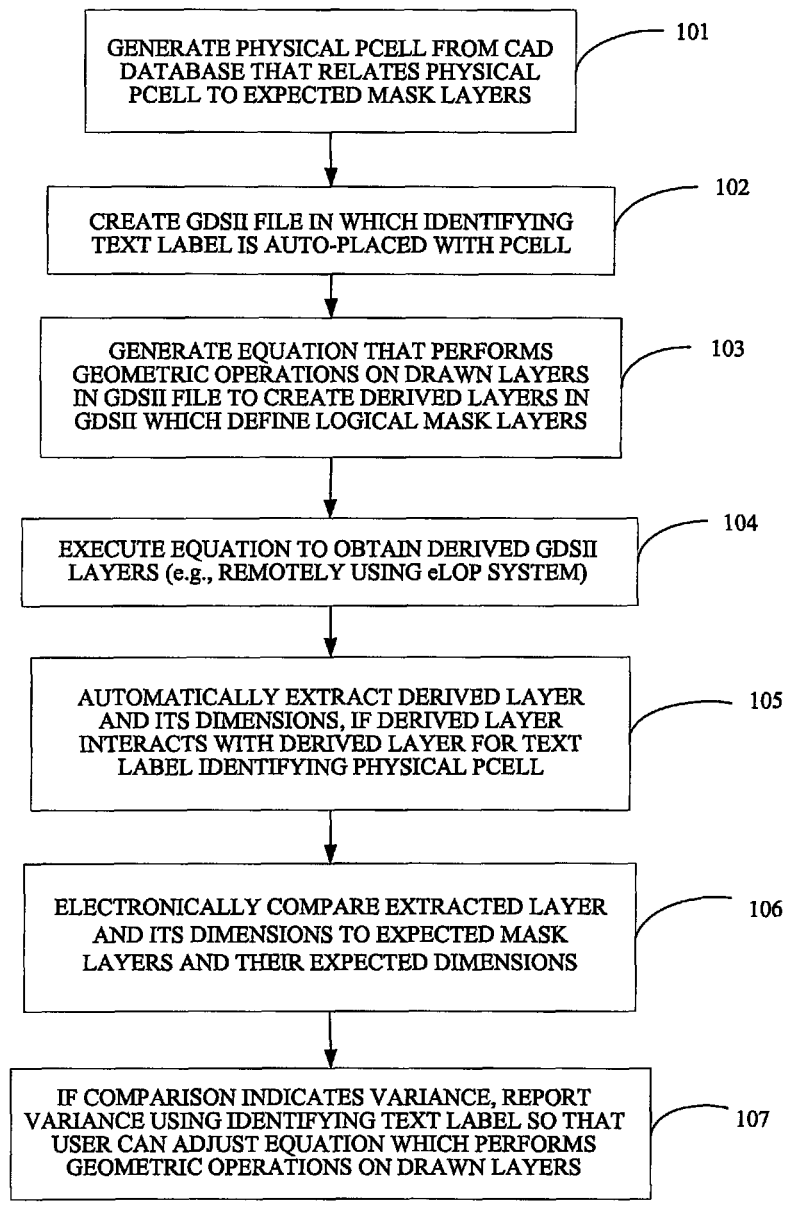
FIG. 1B is a flowchart diagram of a process for automatically verifying logical operations on a GDSII representation of a photomask, in accordance with an example embodiment.

FIG. 1B is a flowchart diagram of a process for automatically verifying logical operations on a GDSII representation of a photomask, in accordance with an example embodiment.

It will be appreciated that this process might be performed as part of a computer-aided design (CAD) flow, such as the CAD flow shown in FIG. 1A, in conjunction with an EDA application (or tool) having a graphical user interface (GUI), e.g., a software program which runs on a general or special-purpose computer. In an example embodiment, the EDA application might be a toolchain that includes Altera's Quartus® II and third-party tools.

In the first operation 101 of the process, an EDA application generates a physical parameterized cell (PCell) from a CAD database that relates the physical PCell to a collection of expected mask layers. Here it will be appreciated that a physical PCell comprises programming code (e.g., a macro) to generate a physical representation (e.g., layout drawing) of an electronic component, showing the physical structure of the latter inside an IC, based on the values of input parameters (e.g., dimensions such as width and length). That is to say, the physical PCell code generates (draws) the actual shapes of the mask design for the IC, based on the input parameters.

In the second operation 102 of the process, the EDA application creates a file in GDSII stream format in which a text label identifying the PCell is auto-placed with the PCell. Here it will be appreciated that the GDSII stream format enables the description of objects such as planar geometric shapes (e.g., polygons) and text labels using attributes that include layer and data type. In the third operation 103, the EDA application generates an equation that performs geometric operations on the layers (also referred to as "drawn layers") to create derived layers, also in GDSII stream format, which define logical (as opposed to actual) mask layers. In the fourth operation 104, the EDA application executes the equation to obtain the derived layers. As explained below, this operation might be performed by an eLOP (electronic logic operation) system. In the fifth operation 105 of the process, the EDA application automatically extracts (e.g., using a custom CAD flow) a derived layer and some or all of its dimensions, if that derived layer interacts with the derived layer for the text label identifying the physical PCell, where "interacts" includes (a) touching the derived layer for the text label or (b) being above or below the derived layer for the text layer. In the sixth operation 106, the EDA application electronically compares the extracted layer and its dimensions to the expected mask layers and their dimensions. Then in the seventh operation 107, the EDA application reports a variance based on the identifying text label, if the comparison indicates that a variance has occurred. Using this variance report, the user of the EDA application can adjust the equation that performs the geometric operations on the drawn layers.

As described above, the EDA application creates a file in GDSII stream format in operation 102 of the process. In alternative example embodiments, other suitable file formats might be used, including OASIS® (Open Artwork System Interchange Standard) and CIF (Caltech Intermediate Format). Also, as described above, the EDA application generates an equation that performs geometric operations in operation 103 of the process. However, in alternative example embodiments, the equation might perform other transformations such as set operations such as union, intersection, complement, Cartesian product, etc.

As described above, the EDA program executes the equation in operation 104, remotely using the eLOP system in an example embodiment. An eLOP system has been developed by Taiwan Semiconductor Manufacturing Company (TSMC) and is described in U.S. Published Patent Application No. 2008/0022254. It is sometimes also referred to as "remote mask database check". However, in an alternative example embodiment, the EDA program might use one of its own software modules to execute the equation.

FIG. 2 is a GUI view displaying a database table whose columns indicate expected mask layers in NMOS (n-type metal-oxide-semiconductor) transistors, in accordance with an example embodiment. It will be appreciated that this figure relates to operation 101 of the process described above. As depicted in the figure, a GUI view 201 displays a database table 202 whose rows describe numbered devices that are NMOS transistors (e.g., devices whose Device Type is "TN"). Thus, Device No. 30 is an NMOS transistor named "Transistor 30" that corresponds to a PCell whose name 203 is "TNG45DS". As shown by the binary flags in the columns towards the right of the database table, this device/PCell includes various expected mask layers such as mask layer G shown in database table column 204. Here it will be appreciated that a value of 1 for a binary flag indicates the expected presence of the mask layer in the device/Pcell and a value of 0 for the binary flag indicates the expected absence of the mask layer in the device/Pcell.

Figure 3:
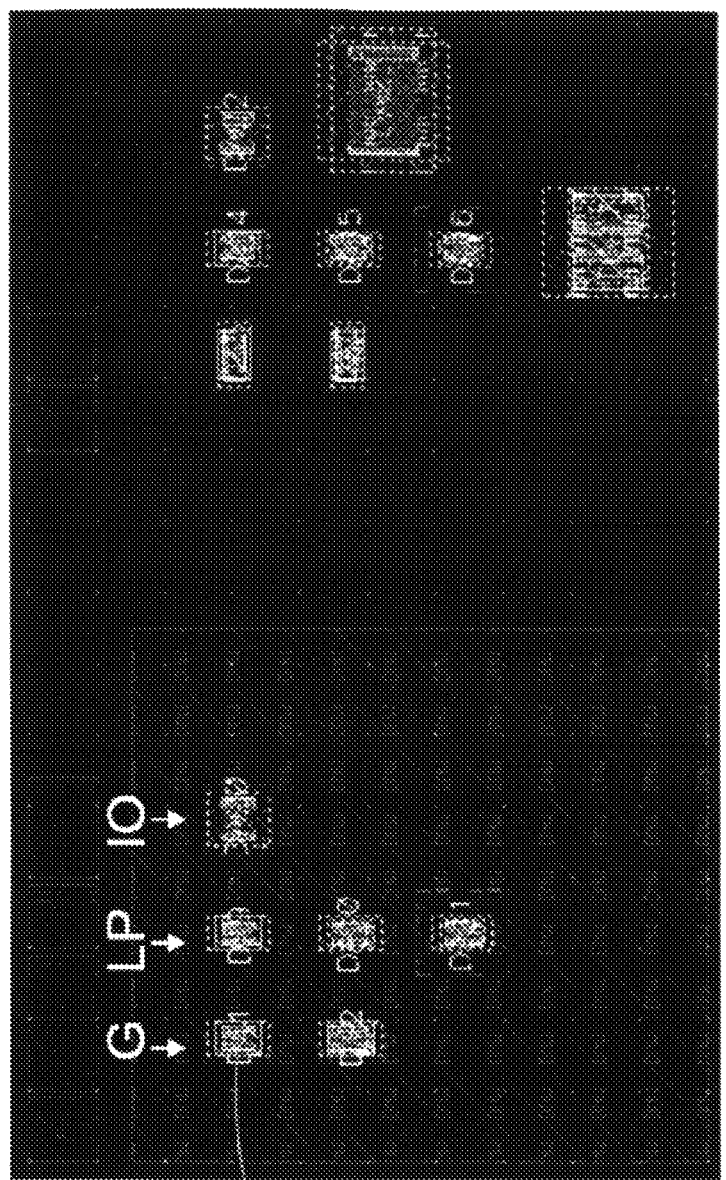
FIG. 3 is a diagram illustrating the auto-placement of text labels with physical PCells for NMOS transistors, in accordance with an example embodiment.

FIG. 3 is a diagram illustrating the auto-placement of text labels with physical PCells for NMOS transistors, in accordance with an example embodiment. It will be appreciated that this figure relates to operation 102 of the process described above. Table 301 at the top of the figure depicts a hierarchy of NMOS transistors (e.g., TN). According to the hierarchy, NMOS transistors can be either "Inside DNW" or "No DNW". Here it will be appreciated that DNW stands for "Deep N-Well". In turn, the NMOS transistors that are "Inside DNW" can be "G-Transistor", "LP-Transistor", or "IO Transistor", where "G" stands for generic, "LP" stands for low power, and "IO" stands for input/output. Likewise, the NMOS transistors that are "No DNW" can be "G-Transistor", "LP-Transistor", or "IO Transistor".

As shown in Table 301, TNG45DS is the NMOS transistor that is "Inside DNW" and that is a G device. FIG. 3 includes an explanation of terminology for this transistor. According to that explanation, "T" stands for transistor, "N" stands for NMOS, "G" stands for generic, "45" stands for 45 nm process (per the International Technology Roadmap for Semiconductors), "D" stands for DNW, and "S" stands for "SVT" (standard threshold voltage). Diagram 302 in the figure shows an indentifying text label 303 (including the characters "D" and "1") juxtaposed with its corresponding polygons, following generation of the PCell for TNG45DS and auto-placement of the text label.

Figure 4:
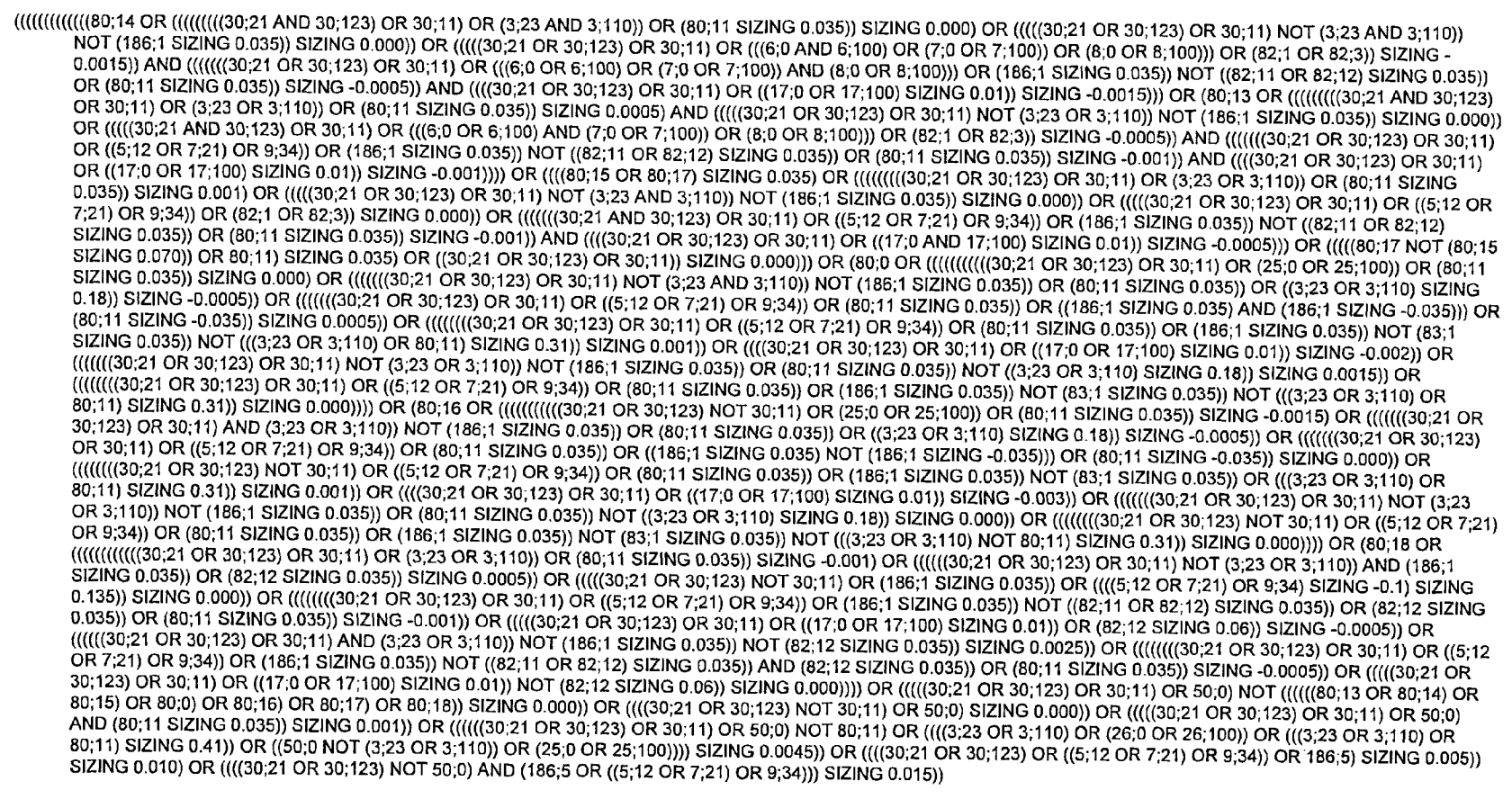

FIG. 4 is a diagram showing an example equation that performs geometric operations on drawn layers, in accordance with an example embodiment. This equation is merely meant to be illustrative as to the complexity of such equations; the derived layers resulting from the geometric operations in FIG. 4 would not be useful in a real design for an IC. It will be appreciated that this figure relates to operation 103 of the process described above. Such operations are well-known in the art and are described in co-owned U.S. Pat. No. 7,139,997, which is incorporated herein by reference. The geometric operations shown in FIG. 4 include both Boolean operations on polygons (e.g., AND, NOT, OR, etc.) and sizing operations (e.g., expansion and shrinkage). The polygons are expressed in terms of GDSII stream format, e.g., "(80:14)", where the first number indicates a layer and the second number indicates a data type. As noted above, other formats such as OASIS® might be used in alternative example embodiments.

FIG. 5 is a diagram illustrating the drawn layers and the derived layers for an NMOS transistor, in accordance with an example embodiment. It will be appreciated that this figure relates to operations 102-105 of the process described above.

The drawn layers 501 relate to a physical PCell, e.g., for a TNG45S (an NMOS transistor that is "No DNW" and that is a G-transistor), and are stored in a GDSII file, as indicated in the figure. Also as indicated in the figure, the drawn layers 501 include the text label "DA5", which has been auto-placed. The derived layers 502 result from execution of an equation involving geometric operations on the drawn layers 501 such as the equation shown in FIG. 4. It will be appreciated that some of these geometric operations were sizing operations which increased the size of some of the polygons in the drawn layers 501. As indicated in the figure, the derived layers 502 also include the text label "DA5", which might been auto-placed prior to transmission of the input GDSII file to an eLOP system, in an example embodiment. In an alternative example embodiment, the text label "DA5" might have been subsequently auto-placed following receipt of the output GDSII file from the eLOP system. Also shown in the figure is a table 503 which shows results of automated measurements (e.g., 0.298) taken on dimensions (e.g., X-Dir) of the derived layers (e.g., eLOP layer (6;50)) that interact with the text label ("DA5") layer, where "interact" includes (a) touching the derived layer for the text label or (b) being above or below the derived layer for the text layer.

FIG. 6 is a schematic diagram illustrating the derived layers that interact with the derived layer for a text identifier, in accordance with an example embodiment. It will be appreciated that this figure relates to operation 105 of the process described above. The figure depicts the derived layers relating to a device/PCell, including a derived layer that includes an identifying text label "DA9", e.g., the so-called "ID layer". As noted in the figure, an EDA application extracts and measures the layers that interact with the ID layer, where "interact" includes (a) touching the ID layer or (b) being above or below the ID layer. If a derived layer has no interaction with the ID layer, the EDA application does not extract and measure the derived layer.

FIG. 7 is a diagram showing a table with (a) expected mask layers and (b) expected dimensions for a poly (PO) layer and a thin oxide (OD) layer in various NMOS and PMOS (p-type metal-oxide-semiconductor) transistors, in accordance with an example embodiment. It will be appreciated that this figure relates to operation 106 of the process described above. The figure is composed of three tables. Table 701 might be used by an EDA program to verify that the derived mask layers in a device/PCell which is a G-transistor correspond to the expected mask layers. As indicated in the table's legend, a binary flag of 1 indicates that a mask layer (e.g., OD, PO, etc.) is expected for a particular device, whereas a binary flag of 0 indicates that a mask layer is not expected. It will be appreciated that these binary flags might be implemented in a bit vector for fast comparison via a bitwise operation (e.g., AND) with a bit vector that records the derived layers that were extracted by the EDA application. Table 702 might be used by an EDA program to verify the correspondence between an expected dimension (e.g., 0.298) and an actual dimension in a derived OD layer in various devices (G and NMOS, G and PMOS, LP+ and NMOS, LP+ and PMOS, I/O and NMOS, I/O and PMOS). Table 703 might be used by an EDA program to verify the correspondence between an expected dimension (e.g., 0.12) and an actual dimension in a derived PO layer in various devices (G and NMOS, G and PMOS, LP+ and NMOS, LP+ and PMOS, I/O and NMOS, I/O and PMOS). As indicated by the last column in both tables 702 and 703, no errors (0.00%) or variances are expected.

Figure 8:
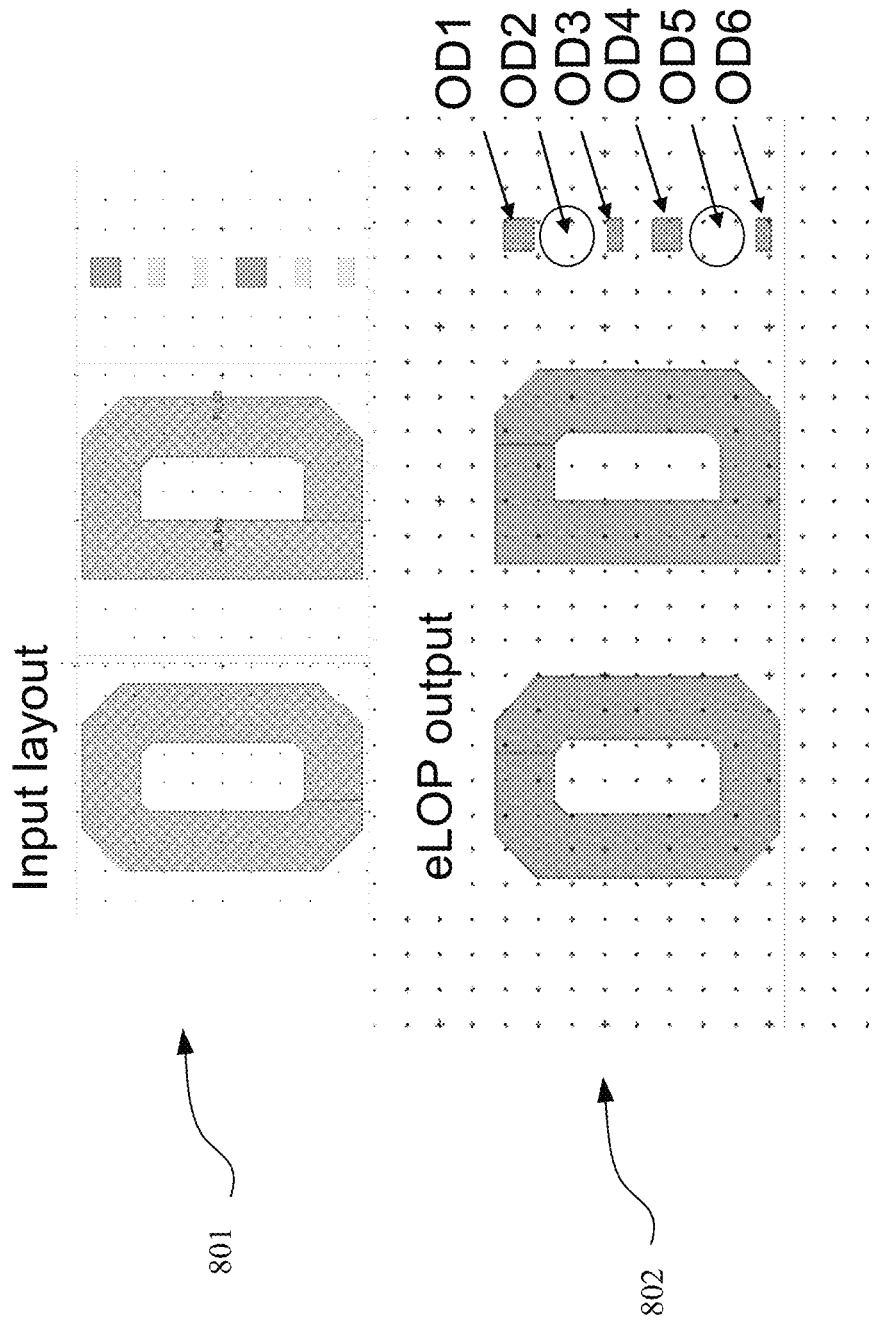
FIG. 8 is a diagram illustrating an automated detection of a variance in a derived OD layer, in accordance with an example embodiment.

FIG. 8 is a diagram illustrating an automated detection of a variance in a derived OD layer, in accordance with an example embodiment. The drawn layers in the input layout 801 include six polygons identified symbolically (rather than in GDSII stream format) as OD1, OD2, OD3, OD4, OD5, and OD6. However, two of these polygons, e.g., OD2 and OD5, are missing from the derived layers in the output layout 802 received from the eLOP system. Using the process described above, an EDA application might discover the missing polygons and report a variance that identified their location in terms of their layers and data types.

Although the foregoing example embodiments have been described in some detail for purposes of clarity of understanding, it will be apparent that certain changes and modifications might be practiced within the scope of the appended claims. For example, the transformational operations in the equation might be other than geometric or set operations. Accordingly, the example embodiments are to be considered as illustrative and not restrictive. And the invention is not to be limited to the details given herein, but might be modified within the scope and equivalents of the appended claims.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

What is claimed is:

1. A method, comprising:

spatially associating a text label with a physical parameterized cell created at least in part from a computer assisted design database that relates the physical parameterized cell to a plurality of expected mask layers, wherein the text label is integrated into each layer of the plurality of expected mask layers and wherein the text label is indicative of a layer of the physical parameterized cell in a circuit design;

converting the physical parameterized cell and the text label to a format that represents the physical parameterized cell and the text label as a plurality of drawn mask layers, wherein the text label is integrated into each layer of the plurality of drawn mask layers;

generating an initial equation that performs transformational operations on the plurality of drawn mask layers to create a plurality of derived mask layers;

executing the initial equation to generate the plurality of derived mask layers; and comparing a derived mask layer of the plurality of derived mask layers to the expected mask layers if the derived mask layer touches, is above, or is below a derived mask layer for the text label, wherein at least one operation is executed by an integrated circuit.

2. A method as in claim 1, further comprising: reporting a variance if the compared derived mask layer varies from one of the plurality of expected mask layers.

3. A method as in claim 1, wherein each one of the plurality of drawn mask layers or the plurality of derived layers has an associated data type.

4. A method as in claim 1, wherein the comparing operation further comprises: measuring one or more dimensions of the derived mask layer and comparing a measured dimension to an expected dimension.

5. The method of claim 1, wherein the transformational operations include operations that are selected from the group consisting of Boolean operations and sizing operations.

6. The method of claim 1, wherein the equation execution is performed by an electronic logic operation system.

7. The method of claim 1, wherein the format is Graphics Design System II stream format.

8. The method of claim 1, further comprising: executing a revised equation that performs transformational operations on the plurality of drawn mask layers, wherein the revised equation resulted at least in part from a change to the initial equation based on a reported variance.

9. A logical photomask with logical mask layers prepared by a process comprising the operations of:

spatially associating a text label with a physical parameterized cell created at least in part from a computer assisted design database that relates the physical parameterized cell to a plurality of expected mask layers, wherein the text label is integrated into each layer of the plurality of expected mask layers;

converting the physical parameterized cell and the text label to a format that represents the physical parameterized cell and the text label as a plurality of drawn mask layers, wherein the text label is integrated into each layer of the plurality of drawn mask layers;

generating an initial equation that performs transformational operations on the plurality of drawn mask layers to create a plurality of derived mask layers;

executing the initial equation to generate the plurality of derived mask layers; and comparing a derived mask layer of the plurality of derived mask layers to the expected mask layers if the derived mask layer touches, is above, or is below a derived mask layer for the text label, wherein at least one operation is executed by an integrated circuit.

10. A logical photomask as in claim 9, further comprising: reporting a variance if the compared derived mask layer varies from one of the plurality of expected mask layers.

11. A logical photomask as in claim 9, wherein each one of the plurality of drawn mask layers or the plurality of derived layers has an associated data type.

12. A logical photomask as in claim 9, wherein the comparing further comprises: measuring one or more dimensions of the derived mask layer and comparing a measured dimension to an expected dimension.

13. A logical photomask as in claim 9, wherein the transformational operations include operations that are selected from the group consisting of Boolean operations and sizing operations.

14. A logical photomask as in claim 9, wherein the equation execution is performed by an electronic logic operation system.

15. A logical photomask as in claim 9, wherein the format is Graphics Design System II stream format.

16. A logical photomask as in claim 9, further comprising: executing a revised equation that performs transformational operations on the plurality of drawn mask layers, wherein the revised equation resulted at least in part from a change to the initial equation based on a reported variance.

17. Software encoded in one or more non transitory computer-readable media and when executed by an integrated circuit operable to:

spatially associating a text label with a physical parameterized cell created at least in part from a computer assisted design database that relates the physical parameterized cell to a plurality of expected mask layers, wherein the text label is integrated into each layer of the plurality of expected mask layers;

converting the physical parameterized cell and the text label to a format that represents the physical parameterized cell and the text label as a plurality of drawn mask layers, wherein the text label is integrated into each layer of the plurality of drawn mask layers;

generating an initial equation that performs transformational operations on the plurality of drawn mask layers to create a plurality of derived mask layers;

executing the initial equation to generate the plurality of derived mask layers; and comparing a derived mask layer of the plurality of derived mask layers to the expected mask layers if the derived mask layer touches, is above, or is below a derived mask layer for the text label.

18. The software of claim 17, further operable to report a variance if the compared derived mask layer varies from one of the plurality of expected mask layers.

* * * * *